US008198798B2

(12) United States Patent
Chuang et al.

(10) Patent No.: US 8,198,798 B2
(45) Date of Patent: Jun. 12, 2012

(54) FLUORESCENT SUBSTANCE HAVING A CONTROLLED IMPURITY DOPING OF ZINC AND LIGHT-EMITTING DEVICE USING THE SAME

(75) Inventors: Yao-Tsung Chuang, Tainan (TW); Jen-Shrong Uen, Tainan (TW); Chih-Lung Lin, Tainan (TW); Yuan-Jen Chuang, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 13/102,505

(22) Filed: May 6, 2011

(65) Prior Publication Data

US 2011/0273078 A1    Nov. 10, 2011

(30) Foreign Application Priority Data

May 7, 2010   (TW) ................................ 99114641 A

(51) Int. Cl.
 *H01J 1/63*   (2006.01)
 *C09K 11/78*   (2006.01)
(52) U.S. Cl. .......... 313/483; 313/498; 313/512; 445/24; 252/301.4 F
(58) Field of Classification Search .................. 313/483, 313/498–512; 252/301.4 F; 445/24–25; 428/690; 427/66, 532–535, 539; 438/26–29
See application file for complete search history.

(56) References Cited

U.S. PATENT DOCUMENTS

2007/0103057 A1*  5/2007  Sohn et al. ..................... 313/503
2007/0159060 A1*  7/2007  Shimizu et al. ............... 313/498

FOREIGN PATENT DOCUMENTS

JP        2000-219879 A        8/2000
* cited by examiner

*Primary Examiner* — Tracie Y Green
(74) *Attorney, Agent, or Firm* — Ladas & Parry LLP

(57) ABSTRACT

A fluorescent substance includes zinc with a concentration not larger than 400 ppm, and a composition represented by the following formula (I):

$$Ln_3(Al_xGa_{1-x})_5O_{12}:Ce_y \qquad (I)$$

wherein $0.4 \leq x \leq 0.97$ and $0.038 \leq y \leq 0.048$,

Ln being composed of yttrium, or yttrium and at least one element selected from scandium, lanthanum, gadolinium, samarium, lutetium, and terbium. An emission spectrum of the fluorescent substance as it is excited by light has a dominant wavelength ranging from 500 nm to 550 nm.

10 Claims, 2 Drawing Sheets

FLUORESCENT SUBSTANCE HAVING A CONTROLLED IMPURITY DOPING OF ZINC AND LIGHT-EMITTING DEVICE USING THE SAME

CROSS-REFERENCE TO RELATED APPLICATION

This application claims priority of Taiwanese application No. 099114641, filed on May 7, 2010.

BACKGROUND OF THE INVENTION

1. Field of the Invention

This invention relates to a fluorescent substance and a light-emitting device using the same, more particularly to a fluorescent substance that has an yttrium aluminum garnet (YAG) structure and an emission spectrum having a dominant wavelength ranging from 500 nm to 550 nm.

2. Description of the Related Art

In recent years, light emitting diodes (LED) have been widely applied and serve as a light source in various devices such as fluorescent light, vehicle lighting equipment, display board, and back light for a liquid crystal display, etc. LEDs have the advantages of high light emission efficiency, small size, low power consumption, etc. Moreover, manufacturing cost of the LED is relatively low.

At present, there are two primary methods for producing white light LEDs. One is to use individual LEDs that respectively emit red, green, and blue lights, and then to mix the lights, thereby forming white light. The other is to use a phosphor or fluorescent material to convert monochromatic light emitted from an original LED (mostly blue or ultraviolet LED), followed by mixing the light from the original LED and from the fluorescent material to produce light that appears white. Depending on the color of the original LED, the fluorescent substance that emits light of different colors may be adjusted. For the second method, the original LED is usually a blue LED. Fluorescent substances that emit yellow light or red and green light after being excited by the blue LED are mostly used accordingly.

Although the LEDs produced from the above second method may emit high intensity white light, there is a problem of lower emission efficiency than normal LEDs due to heat loss from the Stokes shift and other degradation issues. Particularly, a blue LED combined with yellow-emitting fluorescent material has inferior luminance and color saturation, and thus, cannot be used as a back light source. For a blue LED combined with red-emitting and green-emitting fluorescent materials, the green-emitting fluorescent material has problems of low luminance and insufficient durability. For example, a silicate fluorescent material is easily deteriorated because of its hygroscopic property; and a nitrogen series fluorescent material usually has inferior luminance.

Japanese Publication No. 2000-219879 discloses a fluorescent substance used for a field emission display (FED). The fluorescent substance includes alkali metals and alkaline-earth metals and a composition represented by $Ln_3(Al_{1-x}Ga_x)_5O_{12}$:Re, wherein Ln is yttrium(Y), lanthanum(La), or gadolinium(Gd), Re is terbium(Tb), cerium(Ce), or europium (Eu), and $0 \leq x \leq 1$. The content of the alkali metals and the alkaline-earth metals is lower than 5 ppm. By controlling the content of the impurities, i.e., the alkali metals and the alkaline-earth metals, the luminance and durability of the fluorescent substance can be improved. Nevertheless, the Japanese publication does not discuss the relation between the ratio of metal elements of the composition of the fluorescent substance and the luminance thereof. Moreover, control of all of the alkali metals and the alkaline-earth metals is somewhat complicated. In addition, the fluorescent substance is produced by co-precipitation without using flux, which has low production efficiency, and thus is inapplicable for industrial mass production.

Therefore, it is desirable in the art to provide a fluorescent substance that has the properties of high luminance, color saturation and long durability, as well as being applicable for industrial production.

SUMMARY OF THE INVENTION

The object of the present invention is to provide a fluorescent substance and a light emitting device using the same.

According to one aspect of the present invention, a fluorescent substance comprises zinc with a concentration not larger than 40 ppm, and a composition represented by the following formula (I):

$$Ln_3(Al_xGa_{1-x})_5O_{12}:Ce_y \qquad (I)$$

wherein $0.4 \leq x \leq 0.97$ and $0.038 \leq y \leq 0.048$,

Ln being composed of yttrium, or yttrium and at least one element selected from the group consisting of scandium, lanthanum, gadolinium, samarium, lutetium, and terbium, wherein an emission spectrum of the fluorescent substance as it is excited by light has a dominant wavelength ranging from 500 nm to 550 nm.

According to another aspect of the present invention, a light emitting device comprises: a light emitting element; and a fluorescent layer comprising a fluorescent substance that includes zinc with a concentration not larger than 40 ppm, and a composition represented by the following formula (I):

$$Ln_3(Al_xGa_{1-x})_5O_{12}:Ce_y \qquad (I)$$

wherein $0.4 \leq x \leq 0.97$ and $0.038 \leq y \leq 0.048$,

Ln being composed of yttrium, or yttrium and at least one element selected from the group consisting of scandium, lanthanum, gadolinium, samarium, lutetium, and terbium, wherein an emission spectrum of the fluorescent substance as it is excited by light from the light emitting element has a dominant wavelength ranging from 500 nm to 550 nm, and the emission spectrum of the fluorescent substance is different from that of the light emitted from the light emitting element.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
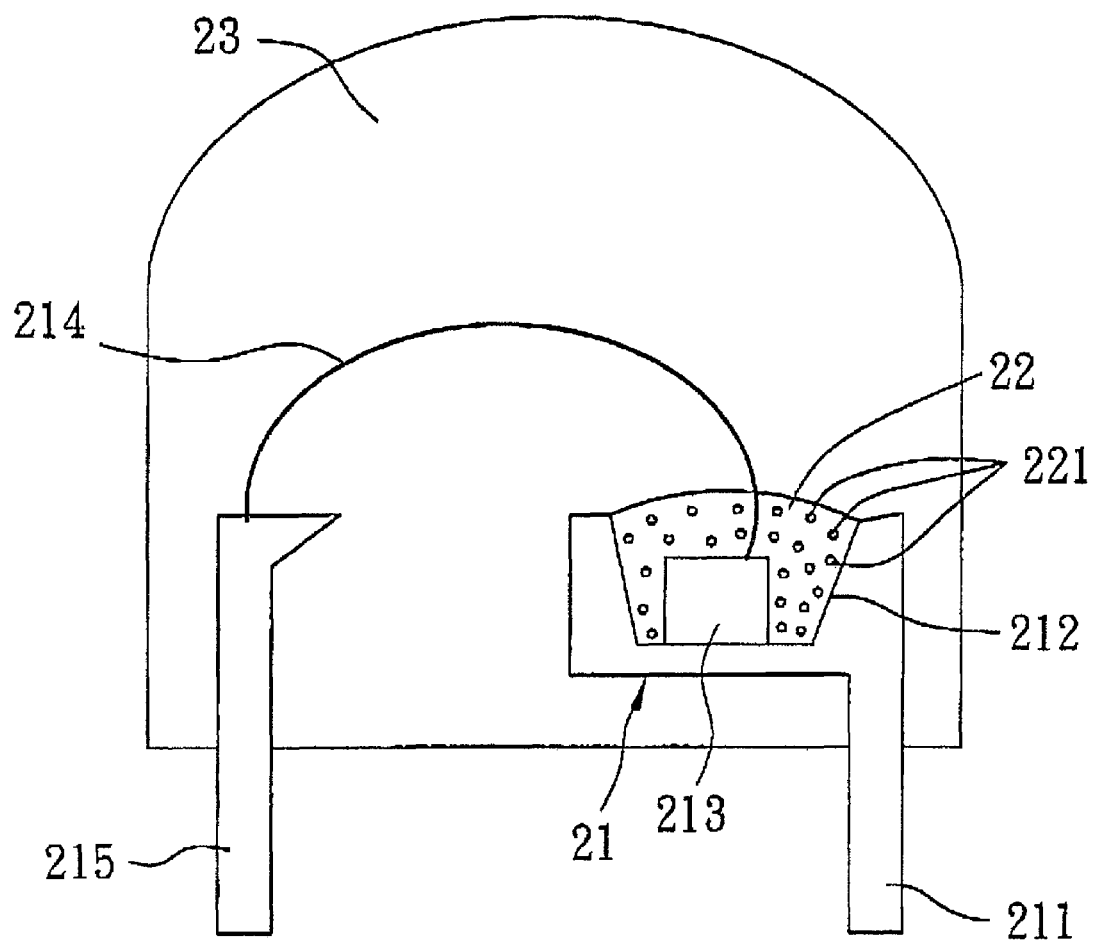
FIG. 1 is a schematic view of the preferred embodiment of a light emitting device according to this invention.

According to the preferred embodiment of the present invention, a fluorescent substance comprises zinc with a concentration not larger than 40 ppm, and a composition represented by the following formula (I):

$$Ln_3(Al_xGa_{1-x})_5O_{12}:Ce_y \qquad (I)$$

wherein $0.4 \leq x \leq 0.97$ and $0.03 \leq y \leq 0.048$,

Ln being composed of yttrium, or yttrium and at least one element selected from the group consisting of scandium, lanthanum, gadolinium, samarium, lutetium, and terbium, wherein an emission spectrum of the fluorescent substance as it is excited by light has a dominant wavelength ranging from 500 nm to 550 nm. The fluorescent substance of this invention has an yttrium aluminum garnet (YAG) structure.

Preferably, the concentration of zinc is not larger than 20 ppm.

In this invention, by controlling the content of gallium and cerium, the emission spectrum of the fluorescent substance can be adjusted to have a dominant wavelength ranging from 510 nm to 540 nm, i.e., wavelength of green light.

The fluorescent substance of the present invention may be produced by a method including the following steps:

(a) uniformly mixing raw materials for the fluorescent substance in a predetermined mole ratio;

(b) sintering the raw materials in a crucible disposed in a furnace under an atmosphere of non-oxidizing gas (such as nitrogen, hydrogen, ammonia, argon, or combinations thereof); and (c) crushing, ball-milling, washing with water, filtering, and drying the sintered raw materials so as to obtain the fluorescent substance.

The raw materials used for producing the fluorescent substance of this invention include metal oxides and metallic compounds containing the elements of the composition of the fluorescent substance, and/or materials that will form the metal oxides of the elements of the composition of the fluorescent substance after heating. For example, the raw materials for yttrium may be yttrium oxide, yttrium hydride, yttrium carbonate, yttrium hydroxide, yttrium aluminum oxide, yttrium aluminium, or combinations thereof. Preferably, the raw material for gallium is gallium oxide.

For uniformly mixing the raw materials, general techniques that are known to those skilled in the art such as dry ball-milling and wet ball-milling may be used, and the description thereof is omitted herein for the sake of brevity. In addition, the raw materials may further include a flux, such as NaF, KF, $BaF_3$, $SrF_2$, $MgF_2$, $AlF_3$, $YF_3$, NaCl, and $BaCl_2$.

It should be noted that the zinc content of the fluorescent substance of this invention may be reduced by decreasing the content of zinc impurity contained in gallium oxide that is used as one of the raw materials.

In step (b), the crucible, which may be made from aluminum oxide, boron nitride, graphite, etc., may precipitate impurities (such as silicon, calcium, etc.) during the sintering process, thereby contaminating the fluorescent substance formed therein. In order to alleviate the contamination, one of the raw materials or a mixture thereof may be pre-sintered in the crucible prior to step (b) so as to form a protective layer on an inner surface of the crucible. Preferably, the pre-sintering process is conducted at 850-1800° C. for 0.5-10 hours. A shorter duration for pre-sintering process and/or a lower sintering temperature are insufficient for producing the protective layer. On the other hand, an excessively long duration and/or a higher temperature may increase manufacturing costs.

In the final produced fluorescent substance, supposing silicon and calcium respectively have concentrations of a ppm and b ppm, it is preferable that $20 < b < 90$ and $30 < 0.9a + 0.1b < 700$ so as to alleviate the adverse influence on the emission efficiency of the fluorescent substance.

Preferably, the fluorescent substance has a form of powder that has a $D_{50}$ particle size ranging from 0.5 μm to 30 μm, more preferably, from 2 μm to 20 μm. A larger particle size may cause problems of sedimentation and low applicability for the fluorescent substance, while an excessively small particle size may result in insufficient luminance.

It should be noted that purity of the fluorescent substance may be improved by repeating the sintering process. During the sintering process, the elements of the raw materials used to form the composition of formula (I) may enter into the lattices of the fluorescent substance, and thus impurities contained in the raw material are likely to be precipitated. Moreover, the washing process in step (c) may help remove the impurities attached to the fluorescent substance. Steps (b) and (c) may be repeated several times to improve the purity of the fluorescent substance, and the number of repetition is adjustable based on actual requirements.

This invention also discloses a light emitting device. FIG. 1 shows the preferred embodiment of a light emitting device according to this invention, which includes a light emitting element 21, a fluorescent layer 22, and a packaging layer 23.

The light emitting element 21 includes conductive bases 211 and 215, in which the conductive base 211 having a recess 212, a light emitting chip 213 disposed in the recess 212 and electrically connected to the base 211, and an electrode 214 electrically connected to the light emitting chip 213 and an external circuit.

The fluorescent layer 22 includes a fluorescent substance 221 as mentioned above. In the examples of this invention, the fluorescent layer 22 is made from a polysilane resin containing 35 wt % of the fluorescent substance 221.

The packaging layer 23 is formed to cover the light emitting element 21 and the fluorescent layer 22. Optionally, the packaging layer 22 may cover part of the base 211. Preferably, the packaging layer 22 is made from a polysilane resin.

EXAMPLE

Sources of Chemicals

1. $Y_2O_3$: commercially available from Changshu Shengchang Rare Earth Smeltery.

2. $Al_2O_3$: commercially available from Sasol North America Pural BT.

3. $CeO_2$: commercially available from Shanghai Yuelong Rare Earth New Materials Co., Ltd.

4. $AlF_3$: commercially available from Metalleare Earth Limited.

5. $Gd_2O_3$: commercially available from Changshu Shengchang Rare Earth Smeltery.

Preparation of $Ga_2O_3$ 18.8 grams of gallium nitrate, 60 ml of 18% ammonia, and 90 ml of pure water were mixed and agitated in a 200 ml reaction container for 30 minutes to obtain 170 ml of gallium hydroxide suspension that had a pH of 9.0. The gallium hydroxide suspension was heated in an oil bath at 95° C. for 5 hours to obtain hydrate of gallium hydroxide, followed by standing the suspension for 30 minutes, removing an upper solution, and washing with water (i.e., adding 90 ml of pure water, mixing, and removing an upper solution). The step of washing with water was repeated four times. Subsequently, the lower solution of the suspension was filtered, and the filtrate was dried at 150° C. for 15 hours to obtain 8.4 grams of hydrate of gallium hydroxide. The hydrate of gallium hydroxide was sintered in a furnace so as to obtain 6.1 grams of gallium oxide ($Ga_2O_3$).

It should be noted that the reaction container used in this invention was a polytetrafluoroethylene (PTFE) container rather than a glass container, thereby preventing precipitation of impurities and contamination of the fluorescent substance, which are likely to occur in a glass container during sintering under an alkaline environment. The pH value of the suspension was controlled to be in the range of 7.5-9.5. At a pH lower than 7.5, the reaction is likely to be incomplete, thereby resulting in a higher content of the impurities and a reduced yield. On the other hand, at a pH higher than 9.5, larger amounts of ammonia are required, which increases manufacturing costs. Repeating the washing step was helpful for removing the impurities attached on the particles of gallium hydroxide. By controlling the temperature of the sintering process, metal impurities that cannot be removed by the washing step may be removed.

Preferably, the pH of the suspension is 7.5-9.5, the temperature and duration of the sintering process are 800-1000° C. and 3-5 hours, and the washing step may be repeated more than four times. By controlling the above conditions during the preparation of gallium oxide, gallium oxide with high purity may be prepared. In the examples of this invention, the sintering process was conducted at 1000° C. for 4 hours.

Examples 1 to 6 and Comparative Examples 1 to 6

Preparation of Fluorescent Substance

Raw materials, i.e., $Y_2O_3$, $Gd_2O_3$, $Al_2O_3$, $Ga_2O_3$, $CeO_2$, and $AlF_3$, were ground and mixed using a dry ball-mill at an appropriate mole ratio to obtain a reaction mixture. The reaction mixture was disposed in a 500 ml crucible made of $Al_2O_3$, followed by sintering in a furnace. The temperature of the furnace was increased from room temperature to 1500° C., and the raw materials were sintered under a nitrogen atmosphere at 1500° C. for 4 hours. After sintering, the raw materials were cooled to room temperature.

The amounts of the raw materials for each of Examples 1 to 6 (E1-E6) and Comparative Examples 1 to 6 (CE1-CE6) are shown in Table 1.

TABLE 1

| | Mole ratio of raw materials | | | | | |
|---|---|---|---|---|---|---|
| | $Y_2O_3$ | $Gd_2O_3$ | $Al_2O_3$ | $Ga_2O_3$ | $CeO_2$ | $AlF_3$ |
| E1 | 0.3 | 0 | 0.485 | 0.015 | 0.0076 | 0.008 |
| E2 | 0.25 | 0.05 | 0.485 | 0.015 | 0.0076 | 0.008 |
| E3 | 0.25 | 0.05 | 0.35 | 0.15 | 0.008 | 0.008 |
| E4 | 0.3 | 0 | 0.35 | 0.15 | 0.008 | 0.008 |
| E5 | 0.3 | 0 | 0.2 | 0.3 | 0.0096 | 0.008 |
| E6 | 0.25 | 0.05 | 0.2 | 0.3 | 0.0096 | 0.008 |
| CE1 | 0.3 | 0 | 0.5 | 0 | 0.0076 | 0.008 |
| CE2 | 0.3 | 0 | 0.425 | 0.075 | 0.012 | 0.008 |
| CE3 | 0.25 | 0.05 | 0.15 | 0.35 | 0.015 | 0.008 |
| CE4 | 0.3 | 0 | 0.485 | 0.015 | 0.0076 | 0.008 |
| CE5 | 0.25 | 0.05 | 0.2 | 0.3 | 0.0096 | 0.008 |
| CE6 | 0.18 | 0.12 | 0.49 | 0.01 | 0.011 | 0.008 |

Measurement of Element Content

For each of E1 to E6 and CE1 to CE6, 0.1 gram of the fluorescent substance was uniformly mixed with 1 gram of $Na_2CO_3$ in a platinum crucible, followed by melting in a furnace at 1200° C. for 5 hours (the temperature of the furnace was increased from room temperature to 1200° C. in 2 hours). After cooling to room temperature, the mixture was added with 25 ml of HCl (36%), followed by heating the solution on a heating plate at 300° C. until the solution became clear. Subsequently, the solution was cooled, disposed in a 100 ml PFA volumetric flask, and added with pure water to a volume of 100 ml, followed by measuring element contents of the fluorescent substance using an inductively coupled plasma atomic emission spectrometer (ICP-AES) commercially available from Jobin Yvon under a trade name of UTIMA-2.

The formula, the element ratio, and the zinc concentration for each of E1 to E6 and CE1 to CE6 are shown in Table 2.

TABLE 2

| | $Ln_3(Al_xGa_{1-x})_5O_{12}:Ce_y$ | | | Zinc Concentration |
|---|---|---|---|---|
| | Ln | x | y | (ppm) |
| E1 | Y | 0.97 | 0.038 | 3.3 |
| E2 | Y/Gd | 0.97 | 0.038 | 17.2 |
| E3 | Y/Gd | 0.7 | 0.04 | 24.8 |
| E4 | Y | 0.7 | 0.04 | 5.4 |
| E5 | Y | 0.4 | 0.048 | 10.6 |
| E6 | Y/Gd | 0.4 | 0.048 | 36.2 |
| CE1 | Y | 1.0 | 0.038 | 1.7 |
| CE2 | Y | 0.85 | 0.06 | 27.6 |
| CE3 | Y/Gd | 0.3 | 0.075 | 38.7 |
| CE4 | Y | 0.97 | 0.038 | 47.8 |
| CE5 | Y/Gd | 0.4 | 0.048 | 127.4 |
| CE6 | Y/Gd | 0.98 | 0.055 | 27.4 |

Measurements of Relative Luminance and Luminance Retention Rate

Figure 2:
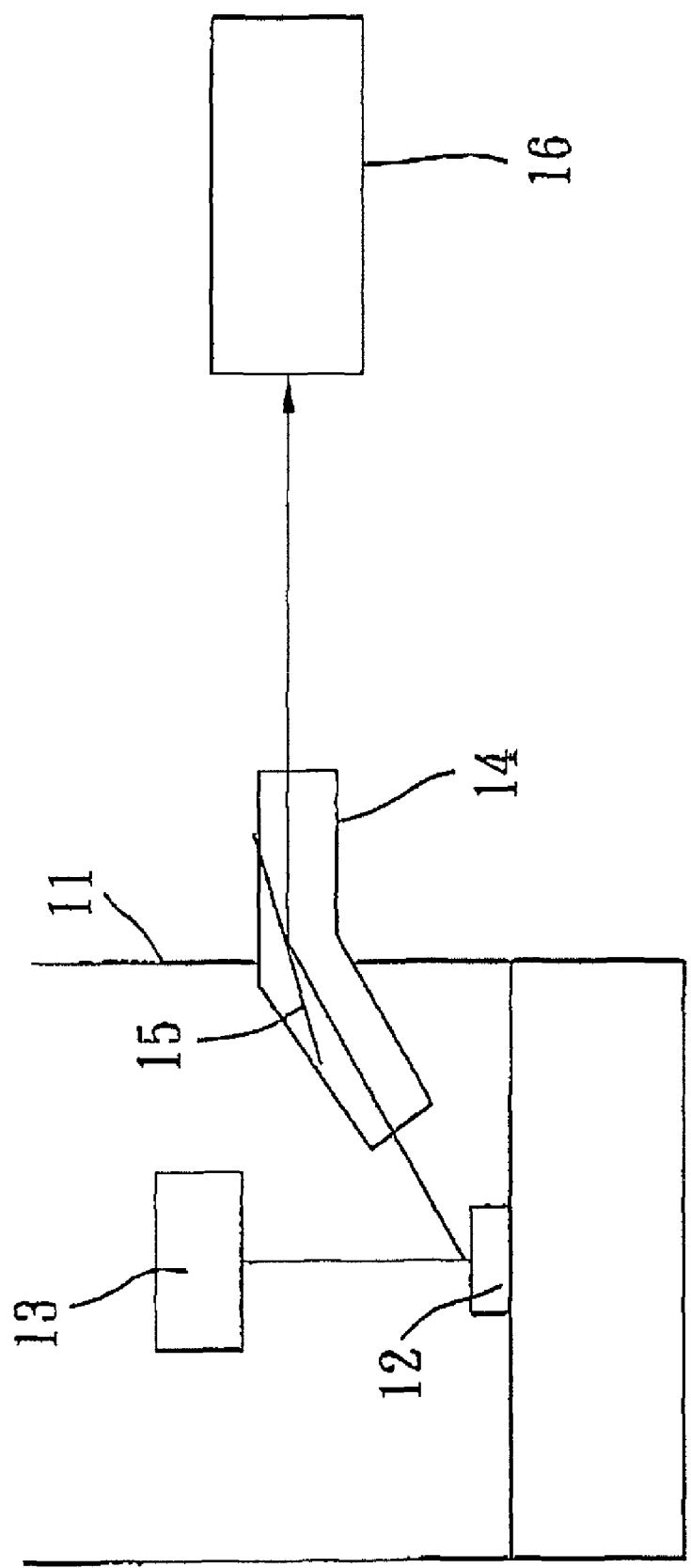
FIG. 2 is a schematic diagram of a luminance measurement device used in this invention.

A luminance measurement device was used to measure the luminance of each of the fluorescent substances of E1 to E6 and CE1 to CE6. As shown in FIG. 2, the luminance measurement device includes a black case body 11, a sample tank 12 disposed in the black case body 11, a light source 13 disposed on top of the sample tank 12 with a distance of 5 cm, a light-guiding tube 14 having a diameter of 2 cm and disposed inclined to the light source 13 at an angle of 45°, a mirror 15 disposed inside the light-guiding tube 14 with a distance of 8 cm from the sample tank 12, and a luminance meter 16 disposed 40 cm from the mirror 15. The luminance meter 16 used in these examples is commercially available from TOPCON under a trade name of SR-3A.

In use, 1.8 grams of the fluorescent substance prepared from each of E1 to E6 and CE1 to CE6 was put and uniformly spread inside the sample tank 12, followed by disposing the sample tank 12 in the black case body 11. The fluorescent substance in the sample tank 12 was irradiated by light emitted from the light source 13 and having a wavelength of 455 nm. The fluorescent substance was excited and subsequently emitted fluorescence. The fluorescence that passes through the light-guiding tube 14 was reflected by the mirror 15 and the luminance thereof was detected by the luminance meter 16 in a field 1° detecting mode.

The relative luminance was obtained using the following equation:

$$\text{Relative Luminance}(\%) = \frac{\text{Luminance of Fluorescent Substance}}{\text{Luminance of Example 1}} \times 100\%.$$

Subsequently, the fluorescent substance of this invention was roasted at 650° C. and air atmosphere for 3 hours. The luminance of the roasted fluorescent substance was measured and compared to the luminance measured before roasting. Luminance retention rate was calculated based on the following equation;

$$\text{Luminance Retention Rate}(\%) = \frac{\text{Luminance after roasting}}{\text{Luminance before roasting}} \times 100\%.$$

The results of relative luminance and luminance retention rate are shown in Table 3. Moreover, the emission spectrum of the fluorescent substance was measured. The dominant wavelength of the emission spectrum, which has the largest intensity during a single measurement, was recorded.

TABLE 3

| | Zinc Concentration (ppm) | Dominant Wavelength (nm) | Relative Luminance (%) | Luminance Retention Rate (%) |
|---|---|---|---|---|
| E1 | 3.3 | 537 | 100 | 100 |
| E2 | 17.2 | 538 | 99 | 98 |
| E3 | 24.8 | 528 | 98 | 98 |
| E4 | 5.4 | 525 | 100 | 100 |
| E5 | 10.6 | 519 | 100 | 99 |
| E6 | 36.2 | 522 | 98 | 97 |
| CE1 | 1.7 | 539 | 98 | 96 |
| CE2 | 27.6 | 529 | 97 | 94 |
| CE3 | 38.7 | 520 | 97 | 94 |
| CE4 | 47.8 | 537 | 97 | 92 |
| CE5 | 127.4 | 522 | 95 | 88 |
| CE6 | 27.4 | 561 | 97 | 94 |

According to Table 3, the fluorescent substances of this invention have relative luminance not less than 98% and luminance retention rate not less than 97%. When the zinc concentration is lower than 20 ppm, the relative luminance and luminance retention rate are increased to be higher than 98%.

The results indicate that, by controlling the elements in the composition of the fluorescent substances and the concentration of zinc, the fluorescent substances of this invention may emit green light with superior luminance and luminance retention rate. It is not necessary to control the content of the total impurities in the fluorescent substances, thereby simplifying the manufacturing process and reducing manufacturing costs.

Examples 7 to 12 (E7 to E12) and Comparative Examples 7 to 12 (CE7 to CE12)

Preparation of Light Emitting Device

The light emitting device shown in FIG. 1 was formed by adhering a 460 nm InGaN blue LED (commercially available from Chi Mei Lighting Technology Corp.), used as the light emitting chip 213, inside the recess 212 of the conductive base 211 using a silver paste (commercially available from UNINWELL under a trade name of BQ6886); providing an electrode 214 that electrically connects to the InGaN blue LED; spreading a polysilane resin containing 35% of the fluorescent substance 221 in the recess 212 to cover a top surface of the InGaN blue LED 213, and drying and hardening the same to form the fluorescent layer 22; and applying a polysilane resin on the fluorescent layer 22, a part of the conductive base 211, and a part of the electrode 214, followed by curing the polysilane resin so as to form the packaging layer 23. The species of the fluorescent substance used for preparing the light emitting devices of E7 to E12 and CE7 to CE12 are shown in Table 4.

Measurements of Relative Luminance and Luminance Retention Rate

The luminance measurement device as described above and shown in FIG. 2 was used, except that the luminance meter 16 was commercially available from LifeTek under a trade name of ASM3049-100(F) and that an integrating sphere (not shown) with a diameter of 10 cm was also used to detect the luminance of the fluorescent substance.

The relative luminance was obtained using the following equation:

$$\text{Relative Luminance}(\%) = \frac{\text{Luminance of Light Emitting Device}}{\text{Luminance of Example 7}} \times 100\%.$$

For measuring the luminance retention rate, the light emitting devices of this invention were subjected to a use test in which the light emitting devices were provided a power with a current of 20 mA for 500 hours at 60° C. and a relative humidity of 90%. The luminance of the light emitting device after the use test was measured and was compared to the luminance before the use test. Luminance retention rate was calculated based on the following equation:

$$\text{Luminance Retention Rate}(\%) = \frac{\text{Luminance after test}}{\text{Luminance before test}} \times 100\%.$$

The results of relative luminance and luminance retention rate for the light emitting devices are shown in Table 4.

TABLE 4

| | Fluorescent Substance | Relative Luminance (%) | Luminance Retention Rate (%) |
|---|---|---|---|
| E7 | E1 | 100 | 96 |
| E8 | E2 | 99 | 93 |
| E9 | E3 | 99 | 93 |
| E10 | E4 | 100 | 95 |
| E11 | E5 | 99 | 94 |
| E12 | E6 | 98 | 92 |
| CE7 | CE1 | 97 | 89 |
| CE8 | CE2 | 95 | 88 |
| CE9 | CE3 | 94 | 88 |
| CE10 | CE4 | 92 | 86 |
| CE11 | CE5 | 90 | 83 |
| CE12 | CE6 | 96 | 89 |

According to Table 4, the relative luminance of the light emitting device of this invention is higher than 97%, and the luminance retention rate thereof is higher than 90%, both of which are superior to those of the comparative examples. The results reveal that the light emitting device containing the fluorescent substance of this invention exhibits superior stability and durability.

In conclusion, by controlling the content of gallium, cerium, and zinc in the fluorescent substance of this invention, the luminance and luminance retention rate can be improved and the dominant wavelength of the emission spectrum of the fluorescent substance as it is excited by light is controlled to be in the range of 500-550 nm, i.e., wavelength of green light. Moreover, the light emitting device containing the fluorescent substance of this invention also has superior luminance and luminance retention rate.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A fluorescent substance, comprising zinc with a concentration not larger than 40 ppm, and a composition represented by the following formula (I):

$$\text{Ln}_3(\text{Al}_x\text{Ga}_{1-x})_5\text{O}_{12}:\text{Ce}_y \qquad (I)$$

wherein $0.4 \leq x \leq 0.97$ and $0.038 \leq y \leq 0.048$,

Ln being composed of yttrium, or yttrium and at least one element selected from the group consisting of scandium, lanthanum, gadolinium, samarium, lutetium, and terbium, wherein an emission spectrum of said fluorescent substance as it is excited by light has a dominant wavelength ranging from 500 nm to 550 nm.

2. The fluorescent substance of claim 1, wherein said emission spectrum of said fluorescent substance has a dominant wavelength ranging from 510 nm to 540 nm.

3. The fluorescent substance of claim 1, wherein said concentration of zinc is not larger than 20 ppm.

4. The fluorescent substance of claim 1, after being, heated at 650° C. for 3 hours, having a luminance retention rate not smaller than 95%.

5. The fluorescent substance of claim 4, wherein said luminance retention rate is not smaller than 97%.

6. A light emitting device, comprising:
a light emitting element, and
a fluorescent layer comprising a fluorescent substance that includes zinc with a concentration not larger than 40 ppm and a composition represented by the following formula (I):

   (I)

wherein $0.4 \leq x \leq 0.97$ and $0.038 \leq y \leq 0.048$, Ln being composed of yttrium, or yttrium and at least one element selected from the group consisting of scandium, lanthanum, gadolinium, samarium, lutetium, and terbium, wherein an emission spectrum of said fluorescent substance as it is excited by light from the light emitting element has a dominant wavelength ranging from 500 nm to 550 nm, and said emission spectrum of said fluorescent substance is different from that of said light emitted from the light emitting element.

7. The light emitting device of claim 6, wherein said emission spectrum of said fluorescent substance has a dominant wavelength ranging from 510 nm to 540 nm.

8. The light emitting device of claim 6, wherein said fluorescent substance has a luminance retention rate not smaller than 95% after being heated at 650° C. for 3 hours.

9. The light emitting device of claim 6, wherein said concentration of zinc is not larger than 20 ppm, said fluorescent substance having a luminance retention rate not smaller than 95% after being heated at 650° C. for 3 hours.

10. The light emitting device of claim 9, wherein said fluorescent substance has a luminance retention rate not smaller than 97% after being heated at 650° C. for 3 hours.

* * * * *